US006867625B1

(12) United States Patent
Stoyanov (10) Patent No.: US 6,867,625 B1
(45) Date of Patent: Mar. 15, 2005

(54) METHOD AND APPARATUS FOR HIGH FREQUENCY DIGITAL CARRIER SYNTHESIS FROM PLURAL INTERMEDIATE CARRIER WAVEFORMS

(75) Inventor: Stephen P. Stoyanov, Lodi, NJ (US)

(73) Assignee: ITT Manufacturing Enterprises, Inc., Wilmington, DE (US)

( * ) Notice: Subject to any disclaimer, the term of this patent is extended or adjusted under 35 U.S.C. 154(b) by 9 days.

(21) Appl. No.: 10/668,193

(22) Filed: Sep. 24, 2003

(51) Int. Cl.[7] .............................................. H03B 21/00
(52) U.S. Cl. ....................... 327/105; 327/107; 327/355; 341/147
(58) Field of Search .............................. 327/105, 107, 327/355–358, 361; 341/141, 144, 147, 148

(56) References Cited

U.S. PATENT DOCUMENTS

| | | | |
|---|---|---|---|
| 5,430,764 A | 7/1995 | Chren, Jr. | |
| 5,467,294 A | 11/1995 | Hu et al. | |
| 5,563,535 A | 10/1996 | Corry et al. | |
| 5,596,290 A | 1/1997 | Watkins et al. | |
| 5,673,212 A | 9/1997 | Hansen | |
| 5,737,253 A | 4/1998 | Madisetti et al. | |
| 5,789,950 A | 8/1998 | Nakagawa | |
| 5,999,581 A | 12/1999 | Bellaouar et al. | |
| 6,078,629 A | 6/2000 | Critchlow et al. | |
| 6,236,275 B1 | 5/2001 | Dent | |
| 6,307,441 B1 | 10/2001 | Sharpe | |
| 6,337,778 B1 * | 1/2002 | Gagne | 360/51 |
| 6,347,325 B1 | 2/2002 | Ribner et al. | |
| 6,404,371 B2 * | 6/2002 | Takahashi et al. | 341/148 |
| 6,449,317 B1 | 9/2002 | Critchlow et al. | |
| 6,466,064 B2 * | 10/2002 | Kurogouchi et al. | 327/113 |
| 6,522,176 B1 | 2/2003 | Davis | |
| 6,539,411 B1 | 3/2003 | Johnson | |
| 6,628,638 B1 * | 9/2003 | Sato et al. | 370/343 |

* cited by examiner

Primary Examiner—Timothy P. Callahan
Assistant Examiner—An T. Luu
(74) Attorney, Agent, or Firm—Edell, Shapiro & Finnan, LLC (57) ABSTRACT

A signal synthesizer according to the present invention produces a high speed or high frequency carrier waveform without employing an ASIC or FPGA operating at a sampling rate of greater than twice the carrier frequency. The signal synthesizer basically simulates a high speed or high frequency direct digital synthesizer with a plurality of low speed or low frequency direct digital synthesizers. The low speed synthesizers are operated in parallel and each one produces an intermediate carrier waveform with a frequency less than the desired carrier frequency. The intermediate carrier waveforms are subsequently multiplexed together to form a high frequency digital carrier waveform that is subsequently converted to an analog signal with a high-speed digital-to-analog converter. In addition, the signal synthesizer may perform phase, frequency and/or amplitude modulation.

23 Claims, 3 Drawing Sheets

METHOD AND APPARATUS FOR HIGH FREQUENCY DIGITAL CARRIER SYNTHESIS FROM PLURAL INTERMEDIATE CARRIER WAVEFORMS

BACKGROUND OF THE INVENTION

1. Technical Field

The present invention pertains to signal synthesizers. In particular, the present invention pertains to a digital synthesizer that generates a high frequency signal from a plurality of intermediate frequency waveforms.

2. Discussion of Related Art

Digital communication transmitters operate by modulating a carrier waveform with digital data. One possible way to generate carrier waveforms in digital systems is by utilizing a direct digital synthesizer (DDS). The DDS may be implemented by a field programmable gate array (FPGA), an application specific integrated circuit (ASIC) or other logic device and includes a phase accumulator, a phase-to-amplitude converter and a digital-to-analog converter (DAC). The phase accumulator is typically an accumulator that increments a phase value by a phase increment each time interval. The phase increment is determined by the sampling frequency and carrier frequency. The phase-to-amplitude converter is generally implemented by a sine look-up table read-only memory (ROM) that receives phase information from the phase accumulator and produces digital amplitude values. The DAC converts the digital amplitude values to an analog waveform. A conventional DDS generates a sine wave or carrier waveform. Phase, frequency and/or amplitude modulation may be performed in the digital domain within the DDS and/or within the analog domain subsequent to the digital to analog conversion.

The Nyquist rate defines the minimum sampling rate needed to generate a digital carrier waveform as twice the frequency of that waveform. Generally, realistic applications require a sampling rate greater than twice the carrier frequency to produce a viable signal. With the high frequencies required for most digital communications applications (e.g., approximately 800 MHz for cellular applications, approximately 1500 MHz for a Global Positioning System (GPS) L1 type signal, etc.), it is impractical and inefficient to employ an ASIC, FPGA or other logic device operating at a sampling frequency of more than twice the frequency of the carrier waveform.

OBJECTS AND SUMMARY OF THE INVENTION

Accordingly, it is an object of the present invention to generate a high frequency signal from a plurality of intermediate frequency waveforms.

It is another object of the present invention to employ a plurality of digital synthesizers in parallel to generate intermediate frequency waveforms and to selectively combine the intermediate waveforms to produce a resulting high frequency signal.

Yet another object of the present invention is to generate a modulated high frequency signal from a plurality of modulated intermediate frequency signals.

The aforesaid objects may be achieved individually and/or in combination, and it is not intended that the present invention be construed as requiring two or more of the objects to be combined unless expressly required by the claims attached hereto.

According to the present invention, a signal synthesizer produces a high speed or high frequency carrier waveform without employing an ASIC, FPGA or other logic device operating at a sampling rate of greater than twice the carrier frequency. The signal synthesizer basically simulates a high speed or high frequency direct digital synthesizer with a plurality of low speed or low frequency direct digital synthesizers. The low speed synthesizers are operated in parallel and each one produces an intermediate carrier waveform with a frequency less than the desired carrier frequency. The intermediate carrier waveforms are subsequently multiplexed together to form a high frequency digital carrier waveform that is subsequently converted to an analog signal with a high-speed digital-to-analog converter. In addition, the signal synthesizer may perform phase, frequency and/or amplitude modulation.

The above and still further objects, features and advantages of the present invention will become apparent upon consideration of the following detailed description of specific embodiments thereof, particularly when taken in conjunction with the accompanying drawings wherein like reference numerals in the various figures are utilized to designate like components.

DETAILED DESCRIPTION OF THE PREFERRED EMBODIMENTS

Figure 1:
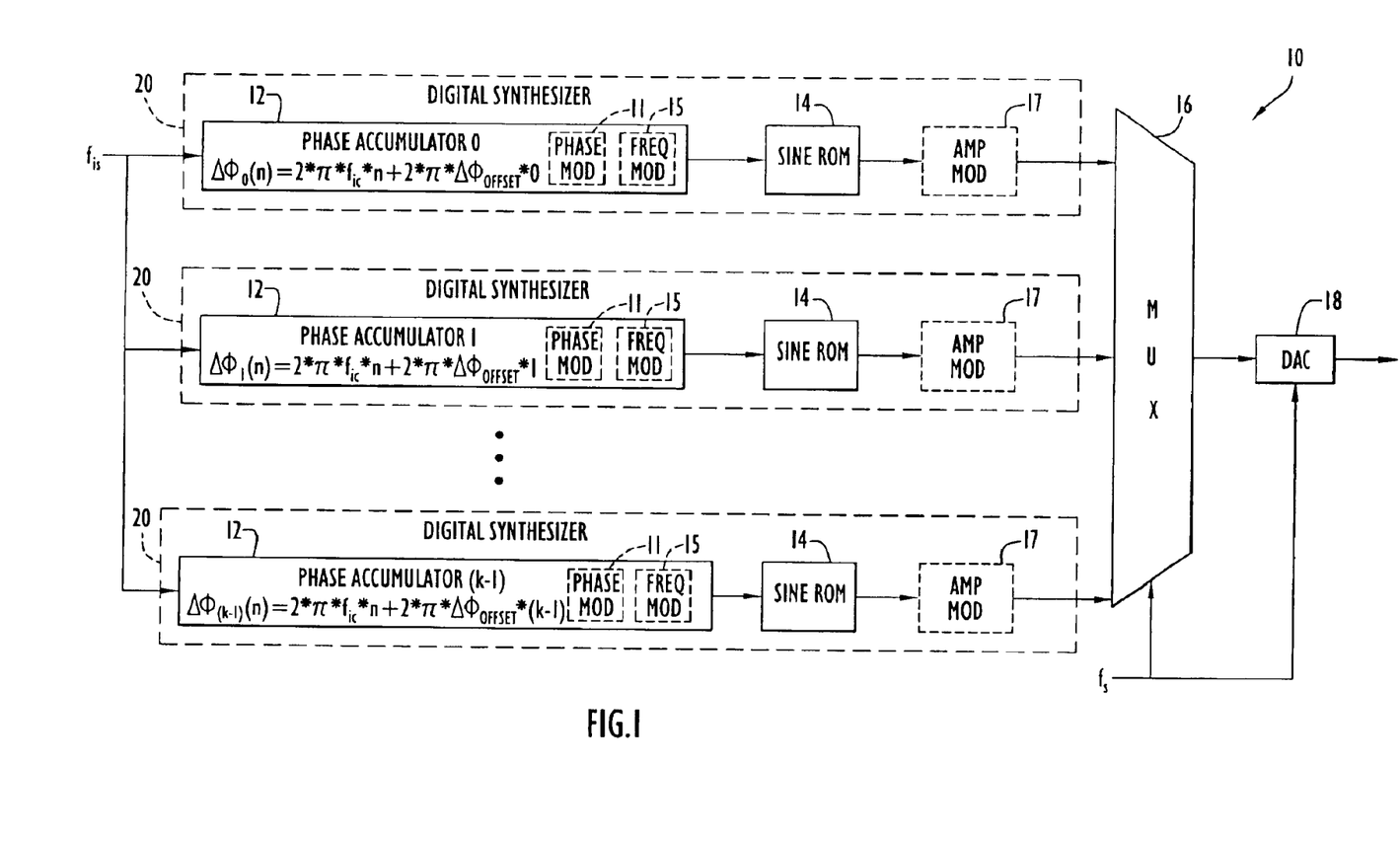
FIG. 1 is a schematic block diagram of the general architecture of a signal synthesizer according to the present invention.

A signal synthesizer according to the present invention is illustrated in FIG. 1. Initially, the signal synthesizer produces a high frequency carrier signal or other waveform without operating a device (e.g., ASIC, FPGA, logic device, etc.) at a sampling rate of greater than twice the frequency of that carrier signal or other waveform. The signal synthesizer basically simulates a high-speed or high frequency direct digital synthesizer (DDS) by employing a plurality of low-speed or low frequency direct digital synthesizers. Specifically, signal synthesizer 10 includes a plurality of digital synthesizer modules 20, a multiplexer 16 and a digital-to-analog converter 18. Digital synthesizer modules 20 are arranged in parallel with each synthesizer module producing a digital waveform with an intermediate frequency less than the frequency of the resulting carrier signal or other waveform as described below. The output of each digital synthesizer module is coupled to multiplexer 16. The multiplexer combines the intermediate frequency waveforms into a digital signal corresponding to the desired carrier signal or other waveform as described below. The multiplexer is coupled to digital-to-analog converter 18 that converts the resulting digital signal to the desired analog carrier signal or waveform. The signal synthesizer may be implemented by various devices (e.g., FPGA, ASIC, logic devices, etc.) and/or circuitry with conventional or custom components.

The quantity of intermediate waveforms required by synthesizer 10 to generate the carrier waveform depends upon the maximum sampling rate of the device (e.g., ASIC, FPGA, logic device, etc.) implementing the synthesizer. In particular, the minimum Nyquist or sampling rate, $f_s$, for a desired carrier or other waveform having a frequency, $f_c$, may be expressed as follows:

$$f_s > 2*f_c. \tag{Equation 1}$$

The quantity of intermediate waveforms, k, utilized to produce the desired waveform for a device (e.g., ASIC, FPGA, logic device, etc.) with a maximum sampling rate, $f_{max}$, may be expressed as follows:

$$k = \lceil f_s/f_{max} \rceil, \tag{Equation 2}$$

where k is rounded up to the nearest integer and $f_s$ is the minimum sampling rate as described above. Since each digital synthesizer module 20 typically produces an intermediate waveform, k digital synthesizer modules are typically employed by synthesizer 10 to produce k intermediate waveforms in order to generate the desired carrier signal or other waveform.

Each digital synthesizer module 20 includes a phase accumulator 12 and a phase-to-amplitude converter 14. The phase accumulator is preferably implemented by an accumulator that increments a phase value by a phase increment each time interval or clock corresponding to an intermediate sampling frequency or rate. This enables the phase accumulator to incrementally cycle through the intermediate waveform. The phase increment is derived from the intermediate sampling rate and the frequency of the desired carrier signal or other waveform as described below. The intermediate sampling rate, $f_{is}$, may be expressed as follows:

$$f_{is} = f_s/k, \tag{Equation 3}$$

where $f_s$ is the minimum sampling rate as described above and k is the quantity of intermediate waveforms utilized to produce the desired carrier signal or other waveform as described above. The frequency of the intermediate signal or waveform, $f_{ic}$, generated by each synthesizer module 20 may be expressed as:

$$f_{ic} = <f_c>_{fis}, \tag{Equation 4}$$

where $f_c$ is the frequency of the desired carrier signal or other waveform as described above, $f_{is}$ is the intermediate sampling rate as described above and $<f_c>_{fis}$ represents the modulus operation which computes the remainder of $f_c/f_{is}$. The modulus operation basically enables an intermediate waveform to oscillate and encompass desired carrier signal or other waveform points when the intermediate waveform is not an integer multiple of or aligned with the desired waveform. In other words, the modulus operation compensates for any frequency offsets between the intermediate waveform and an integer multiple of the desired waveform.

A corresponding phase offset for the particular digital synthesizer module is applied to the accumulated phase value within the phase accumulator to produce a waveform phase value for conversion to a corresponding waveform amplitude value by phase-to-amplitude converter 14. The amplitude value basically corresponds to the waveform amplitude for the particular phase of the waveform. The phase offsets enable generation of a set of intermediate waveforms that are successively shifted in phase by the phase offset and collectively include the points or samples of the desired carrier signal or other waveform as described below. The desired waveform points are subsequently selected from the appropriate intermediate waveforms by multiplexer 16 to generate the desired carrier signal or other waveform as described below. The corresponding phase offset applied by a digital synthesizer module phase accumulator is basically a multiple of the phase offset, $\Delta\phi_{offset}$, which may be expressed as:

$$\Delta\phi_{offset} = (f_c/k)/f_{is}, \tag{Equation 5}$$

where $f_c$ is the frequency of the desired carrier signal or other waveform as described above, k is the quantity of intermediate waveforms utilized to produce the desired carrier signal or other waveform as described above and $f_{is}$ is the intermediate sampling rate as described above.

Phase accumulator 12 within each digital synthesizer module 20 produces the waveform phase value at each time interval or clock corresponding to the intermediate sampling frequency. The waveform phase value, $\Delta\phi_j(n)$, produced by each digital synthesizer module 20 for a corresponding intermediate waveform, j, may be expressed as:

$$\Delta\phi_j(n) = 2*\pi*f_{ic}*n + 2*\pi*\Delta\phi_{offset}*j, \tag{Equation 6}$$

where j is an integer from 0 to k−1, k is the quantity of intermediate waveforms utilized to produce the desired carrier signal or other waveform as described above, $f_{ic}$ is the intermediate waveform frequency as described above, n is the sample number or time and $\Delta\phi_{offset}$ is the phase offset as described above. The term $\Delta\phi_{offset}*j$ basically represents the successive phase shift of the intermediate waveforms or multiple of the phase offset applied by phase accumulator 12 of synthesizer modules 20. The waveform values, $\Delta\phi_j(n)$, produced by synthesizer modules 20 are each applied to a corresponding phase-to-amplitude converter 14 to ascertain a corresponding waveform amplitude value.

Phase-to-amplitude converter 14 is typically in the form of a memory and receives the intermediate waveform values produced by a corresponding phase accumulator 12. Converter 14 is preferably implemented as a sine/cosine lookup table read only memory (ROM) and stores sine and/or cosine values. The converter basically receives the intermediate waveform information from the corresponding phase accumulator and provides the appropriate sine and/or cosine value for each intermediate waveform sample, where the converter value represents the intermediate waveform amplitude for that sample. The output of converter 14, Carrier$_j$(n), for each digital synthesizer module 20 to produce a corresponding intermediate waveform, j, may be expressed as:

$$\text{Carrier}_j(n) = \cos(\Delta\phi_j(n)) = \cos(2*\pi*f_{ic}*n + 2*\pi*\Delta\phi_{offset}*j); \text{ or} \tag{Equation 7}$$

$$\text{Carrier}_j(n) = \sin(\Delta\phi_j(n)) = \sin(2*\pi*f_{ic}*n + 2*\pi*\Delta\phi_{offset}*j), \tag{Equation 8}$$

where j is an integer from 0 to k−1 as described above, k is the quantity of intermediate waveforms utilized to produce the desired carrier signal or other waveform as described above, $\Delta\phi_j(n)$ is the waveform value as described above, $f_{ic}$ is the intermediate carrier or waveform frequency as described above, n is the sample number or time as described above and $\Delta\phi_{offset}$ is the phase offset as described above. The intermediate waveform is preferably generated as a cosine wave; however, converters 14 may provide sine and/or cosine values in order to generate that waveform in any fashion (e.g., cosine wave, sine wave, combination of sine and cosine waves, etc.).

Phase and/or frequency modulation may further be performed by synthesizer modules 20. For example, phase accumulator 12 of each synthesizer module 20 may further include a phase modulation module 11. This module basically applies a modulation phase offset value, phaseoffset(n), to the phase offset that represents a modulated phase at a corresponding sample. The output of converter 14 in the case of phase modulation, PhaseModCarrier$_j$(n), for each digital synthesizer module 20 to produce a corresponding modulated intermediate waveform, j, may be expressed as:

PhaseModcarrier$_j$(n)=
  cos(2*π*f$_{ic}$*n+2*π*Δϕ$_0$*j+phaseoffset(n)); or    (Equation 9)

PhaseModcarrier$_j$(n)=
  sin(2*π*f$_{ic}$*n+2*π*Δϕ$_0$*j+phaseoffset(n)),    (Equation 10)

where j is an integer from 0 to k−1 as described above, k is the quantity of intermediate waveforms utilized to produce the desired signal or waveform as described above, f$_{ic}$ is the intermediate waveform frequency as described above, n is the sample number or time as described above, Δϕ$_{offset}$ is the phase offset as described above and phaseoffset(n) is the modulation phase offset value as described above. The modulated intermediate waveform is preferably generated as a cosine wave; however, converters 14 may provide sine and/or cosine values in order to generate the modulated waveform in any fashion (e.g., cosine wave, sine wave, combination of sine and cosine waves, etc.).

Moreover, phase accumulator 12 of each synthesizer module 20 may further include a frequency modulation module 15. This module basically applies a frequency offset, freqoffset(n), that represents a modulated frequency at a corresponding sample. The output of converter 14 in the case of frequency modulation, FreqModCarrier$_j$(n), for each digital synthesizer module 20 to produce a corresponding modulated intermediate waveform, j, may be expressed as:

FreqModcarrier$_j$(n)=
  cos(2*π*(f$_{ic}$+freqoffset(n))*n+2*π*Δϕ$_{offset}$*j); or    (Equation 11)

FreqModcarrier$_j$(n)=
  sin(2*π*(f$_{ic}$+freqoffset(n))*n+2*π*Δϕ$_{offset}$*j),    (Equation 12)

where j is an integer from 0 to k−1 as described above, k is the quantity of intermediate waveforms utilized to produce the desired signal or waveform as described above, f$_{ic}$ is the intermediate waveform frequency as described above, n is the sample number or time as described above, Δϕ$_{offset}$ is the phase offset as described above and freqoffset(n) is the modulated frequency offset value as described above. The modulated intermediate waveform is preferably generated as a cosine wave; however, converters 14 may provide sine and/or cosine values in order to generate the modulated waveform in any fashion (e.g., cosine wave, sine wave, combination of sine and cosine waves, etc.).

In addition, the digital synthesizer modules may apply amplitude modulation to the digital waveforms produced by converters 14. Specifically, the synthesizer modules may include an amplitude modulation module 17 to produce amplitude modulated values for selection by multiplexer 16. In this case, converters 14 each provide amplitude values to amplitude modulation module 17. The amplitude modulation module applies a constant and/or function, k$_{Amp}$, to the amplitude values to produce a resulting modulated amplitude value. The modulated amplitude value, AmpModCarrier$_j$(n), produced by each digital synthesizer module 20 for a corresponding modulated intermediate waveform, j, may be expressed as:

AmpModCarrier$_j$(n)=k$_{Amp}$*cos(Δϕ$_j$(n)); or    (Equation 13)

AmpModCarrier$_j$(n)=k$_{Amp}$*sin(Δϕ$_j$(n)),    (Equation 14)

where j is an integer from 0 to k−1 as described above, k is the quantity of intermediate waveforms utilized to produce the desired signal or waveform as described above, k$_{Amp}$ is a constant or function for the amplitude modulation, n is the sample number or time as described above and Δϕ$_j$(n) is the waveform phase value as described above. Phase, frequency and amplitude modulation may be applied to an intermediate waveform by a synthesizer module 20 either individually or in any combination.

Figure 2:
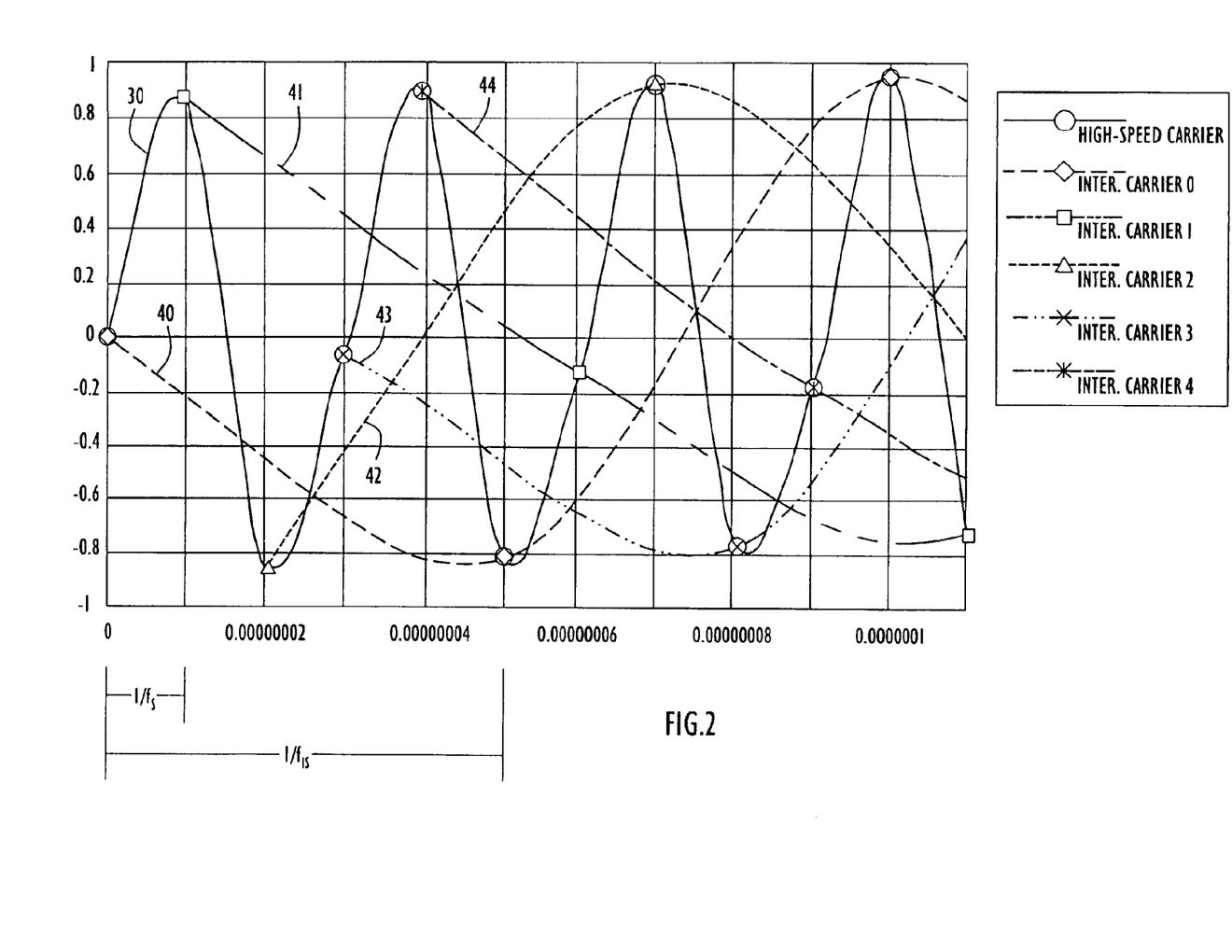
FIG. 2 is a graphical illustration of a plurality of intermediate frequency waveforms and the manner in which these waveforms are combined to produce a high frequency waveform in accordance with the present invention.

The digital waveforms from digital synthesizer modules 20 are selectively combined by multiplexer 16 to produce a digital waveform corresponding to the desired carrier signal or other waveform as illustrated, by way of example only, in FIG. 2. Specifically, the intermediate waveform samples are generated by synthesizer modules 20 (FIG. 1) at each time interval or clock corresponding to the intermediate sampling frequency. An initial intermediate waveform is generated without a phase offset, while the phases of the remaining intermediate waveforms are successively offset from the initial waveform by a multiple of the phase offset, Δϕ$_{offset}$, as described above (e.g., Equations 6, 7 and 8). The phase offsets basically shift the intermediate waveforms successively from the initial waveform to enable the intermediate waveforms to encompass points or samples of the desired carrier signal or other waveform. The phase offset is determined to evenly space the intermediate waveforms within an intermediate sampling interval (e.g., the phase offset basically includes the appropriate portion of the desired carrier frequency attributed to an intermediate waveform (f$_c$/k) divided by the intermediate sampling frequency). Since k minimum sampling intervals, 1/f$_s$, are within an intermediate sampling interval, 1/f$_{is}$ (e.g., 1/f$_{is}$=k*1/f$_s$ derived from Equation 3), each successive intermediate waveform provides a sample of the desired waveform at each successive minimum sampling interval within an intermediate sampling interval. Thus, the phase offsets enable the intermediate waveforms to provide a desired waveform sample at each time interval or clock corresponding to the minimum sampling rate.

For example, the graph of FIG. 2 includes a desired waveform 30 and five intermediate waveforms 40, 41, 42, 43 and 44. By way of example only, the carrier frequency, f$_c$, is 33 MHz with a minimum sampling rate, f$_s$, of 100 MHz, maximum device sampling rate, f$_{max}$, of 20 MHz, an intermediate sampling rate, f$_{is}$, of 20 MHz, an intermediate waveform frequency, f$_{ic}$, of 13 MHz and the quantity of intermediate waveforms, k, of five. The intermediate waveforms are illustrated as inverted 7 MHz (−7 MHz) sine waveforms. In effect, these signals yield the intermediate waveform frequency, f$_{ic}$, of 13 MHz since these signals are applied with respect to the 20 MHz sampling signal, f$_{is}$, of the device. The points or samples for the intermediate waveforms are generated at each intermediate sampling time interval or clock by digital synthesizer modules 20 as described above. Intermediate waveform 40 is generated without a phase offset, while intermediate waveforms 41, 42, 43, 44 are generated with a successive multiple of the phase offset, Δϕ$_{offset}$, as described above. The phase offsets basically shift initial waveform 40 successively to produce values for samples of the desired waveform at each successive minimum sampling time interval or clock within the intermediate sampling interval. In other words, each intermediate waveform in succession provides a desired waveform sample at a successive minimum sampling time interval or clock. Thus, the intermediate waveforms collectively provide samples of the desired waveform at the minimum sampling rate within each intermediate sampling interval.

Multiplexer 16 selects appropriate intermediate waveform samples to generate the desired waveform. Basically, multiplexer 16 selects a sample from each intermediate waveform successively within each intermediate sampling interval. Since the minimum sampling interval is k times greater than the intermediate sampling interval, the multiplexer selects an intermediate waveform sample from a successive intermediate waveform at each minimum sampling time interval or clock. Appropriate samples from the intermediate waveforms may be selected for subsequent intermediate sampling intervals in substantially the same manner described above, thereby retrieving the desired waveform samples from the intermediate waveforms in a cyclical fashion. Multiplexer 16 is driven by a counter (not shown) to cycle through and select samples from the intermediate waveforms (or synthesizers). The digital waveform sample selected by multiplexer 16 is applied to digital-to-analog converter 18 to produce the corresponding portion of the desired analog carrier signal or other waveform at each minimum sampling interval.

Figure 3:
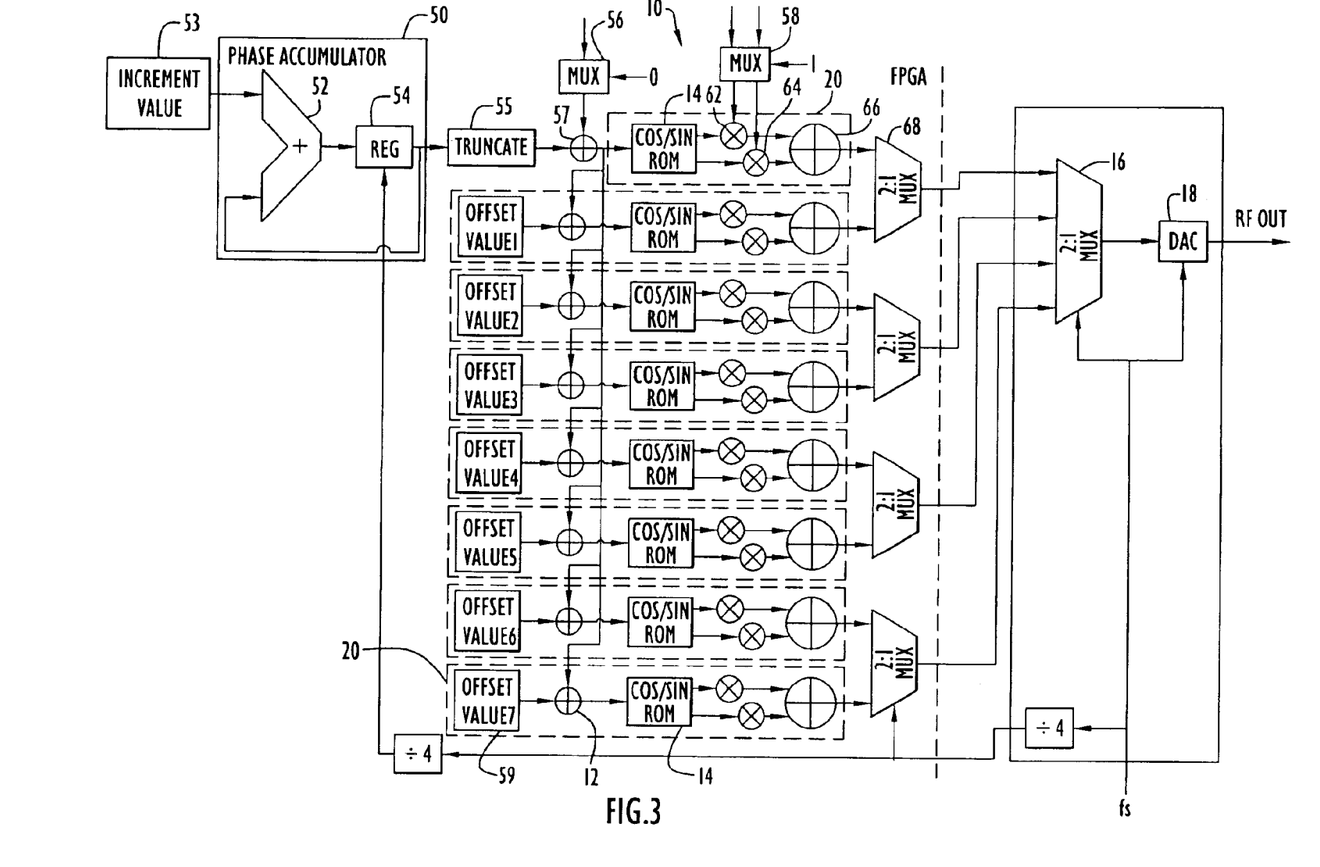
FIG. 3 is a schematic block diagram of an exemplary signal synthesizer of the present invention implemented by a Field Programmable Gate Array (FPGA).

An exemplary embodiment of synthesizer 10 implemented in the form of a field programmable gate array (FPGA) is illustrated in FIG. 3. Specifically, synthesizer 10 is in the form of an FPGA including a plurality of digital synthesizer modules 20, a central or common phase accumulator 50 to provide a phase value to each synthesizer module 20 and a series of mulitplexers 68. The synthesizer further includes a multiplexer 16 and digital-to-analog converter 18 on a separate circuit board and coupled to the FPGA. The phase accumulator includes an adder 52 and a register 54 to store the resulting accumulated phase value from adder 52. The adder receives the previously accumulated phase value from register 54 and a phase increment from an increment register 53 and produces a current accumulated phase value that is stored in register 54 at each time interval or clock corresponding to the intermediate sampling rate. The resulting accumulated phase value from register 54 is applied to a truncate module 55 to remove extraneous result bits. By way of example only, the truncate module receives a thirty-two bit phase value and produces a fourteen bit result by removing the eighteen least significant bits (LSBs). The truncated value is applied to an adder 57 that receives phase modulation information from a phase modulation multiplexer 56. Multiplexer 56 is controlled by a register (not shown) to select either a zero or a phase modulation value for entry into adder 57. The phase modulation value is generated by logic (not shown) and provided at an appropriate data rate. Multiplexer 56 basically serves as a switch to enable or disable phase modulation. A setting to provide a zero value into adder 57 basically enables the adder to provide the accumulated phase value unchanged for distribution to the digital synthesizer modules, thereby effectively disabling phase modulation. Conversely, a setting to provide a phase modulation value enables application of that value to the accumulated phase value and enablement of phase modulation (e.g., Equations 9 and 10). Adder 57 and register 56 basically form phase modulation module 11 of synthesizer modules 20 (FIG. 1) described above. The resulting phase value from adder 57 is applied to an adder 22 of each digital synthesizer module 20.

Adder 22 of each synthesizer module is further coupled to an offset register 59 that contains the phase offset for that synthesizer module (e.g., $\Delta\phi_{offset}*j$). Since the phase offset for the initial waveform or synthesizer module is zero (e.g., $\Delta\phi_{offset}*j=0$ for the initial synthesizer module, where j for that synthesizer module equals zero), an offset register and adder is not needed for that synthesizer module. Adder 22 combines the phase value and phase offset to produce the waveform value, $\Delta\phi_j(n)$, for phase-to-amplitude converter 14 as described above (e.g., Equation 6). Alternatively, a single offset register may be employed to determine the phase offset values for each synthesizer module by using a single offset value and a series of multiplication logic.

Converter 14 of each digital synthesizer module 20 includes an output for cosine values and an output for sine values. By way of example only, the outputs include twelve bits. Each converter output is applied to a corresponding multiplier 62, 64 that receives amplitude modulation information from an amplitude modulation multiplexer 58. Multiplexer 58 is in the form of two multiplexers, each associated with a corresponding multiplier 62, 64. The multiplexers are each controlled by a register (not shown) to select either a value of one or an amplitude modulation value for entry into multipliers 62, 64. The amplitude modulation values are generated by logic (not shown) and provided at an appropriate data rate. With respect to amplitude modulation, the cosine values produced by converter 14 correspond to the In-Phase (I) components, while the sine values correspond to the Quadrature (Q) components. The amplitude modulation values typically include I and Q data streams that are applied to the corresponding I and Q components. Multiplexer 58 basically serves as a switch to enable or disable amplitude modulation. A setting to provide a one value to the multipliers disables amplitude modulation since the converter values are multiplied by one and effectively passed unchanged. Conversely, a setting to provide amplitude modulation values to the multipliers enables amplitude modulation and application of those values to the corresponding converter outputs. The resulting products of multipliers 62, 64 are applied to an adder 66 to produce waveform amplitude values for multiplexer 16. Multipliers 62, 64, amplitude modulation multiplexer 58 and adder 66 basically form amplitude modulation module 17 (FIG. 1) described above, where the amplitude modulated values, AmpModCarrierIQ$_j$(n), may be expressed as:

AmpModCarrierIQ$_j$((n)=
$k_1*\cos(\Delta\phi_j(n))+k_2*\sin(\Delta\phi_j(n))$, (Equation 15)

where j is an integer from 0 to k−1 as described above, k is the quantity of intermediate waveforms utilized to produce the desired signal or waveform as described above, $k_1$ and $k_2$ are values or I and Q data streams (e.g., constants and/or functions) for the amplitude modulation, n is the sample number or time as described above and $\Delta\phi_j(n)$ is the waveform phase value as described above.

Multiplexers 56 and 58 maybe switched at a fast rate in order to provide both phase and amplitude modulation. The multiplexers may be switched inversely (e.g., one multiplexer is permitted to enable the corresponding modulation at one time or, in other words, phase modulation is enabled when amplitude modulation is disabled and phase modulation is disabled when amplitude modulation is enabled) to attain a constant envelope signal with both phase and amplitude modulation. Frequency modulation may be performed as described above (e.g., Equations 11 and 12) by adjusting the phase increment within increment register 53 at an appropriate rate to apply a frequency offset.

In this exemplary embodiment, the cosine and sine values are combined by adder 66 to produce the waveform amplitude value for each synthesizer module. When amplitude modulation is absent, the summation of the sine and cosine values produces the intermediate waveform, and hence the resulting carrier waveform, with a phase shift of forty-five degrees; however, the phase shift is typically irrelevant to receivers that may receive the resulting carrier signal. Alternatively, converters 14 may provide cosine and/or sine values in any fashion to generate the intermediate waveforms. The resulting values from each pair of adjacent synthesizer modules 20 is applied to a corresponding multiplexer 68. The multiplexer alternately selects values from the synthesizer modules as output from the FPGA and is typically driven by a counter (not shown). These outputs are coupled to multiplexer 16 and converter 18, typically implemented by a commercially available digital-to-analog converter with a corresponding 4:1 multiplexer. Multiplexer 16 is typically driven by a counter (not shown). Multiplexers 68 basically enable multiplexer 16 to function as an 8:1 multiplexer and are typically driven to provide the alternate values at a rate twice that of the intermediate sampling rate.

Multiplexers 68 alternately select values as described above, where multiplexer 16 selects a value from each successive multiplexer 68 each minimum sampling interval or clock. Multiplexer 16 basically selects values from each multiplexer 68 in a cyclical fashion until a waveform value from each synthesizer module has been retrieved during an intermediate sampling interval. Thus, values from each of successive k waveforms are selected by multiplexer 16 during an intermediate sampling interval, where a waveform value is available and selected by multiplexer 16 at each minimum sampling interval or clock within the intermediate sampling interval. The order of waveform selection may be controlled by the offsets placed in offset registers 59 and via the selection control lines of multiplexers 16, 68. Each sample selected by multiplexer 16 is converted to an analog signal by digital-to-analog converter 18 at the minimum sampling rate ($f_s$ from Equation 1) to produce the desired analog carrier signal or other waveform as described above. The minimum sampling interval or clock is preferably provided to converter 18, where synthesizer 10 may derive the appropriate clock signals for operation from that minimum sampling clock. The FPGA maybe configured to operate at any desired rate and utilize any quantity of intermediate waveforms.

The FPGA is typically coupled to a user interface (e.g., GUI, microprocessor, etc.) to enable a user to specify the desired waveform. The interface determines the appropriate information (e.g., offsets, rates, increments, modulation values, etc.) as described above and downloads the information to the FPGA for subsequent operation. The signal synthesizer may apply phase, frequency and/or phase modulation to the intermediate waveforms either individually or in any combination.

It will be appreciated that the embodiments described above and illustrated in the drawings represent only a few of the many ways of implementing a method and apparatus for high frequency digital carrier synthesis from plural intermediate carrier waveformns.

The synthesizer may include any quantity of any types of synthesizer modules generating intermediate waveforms at any desired frequencies. The intermediate waveforms maybe selected or produced to partition the desired carrier signal or other waveform in any desired manner (e.g., an even or uniform carrier frequency distribution among intermediate waveforms, a non-uniform carrier frequency distribution among intermediate waveforms, any quantity of intermediate waveforms of any frequency, etc.). The synthesizer may be implemented by any types of conventional or other devices (e.g., ASIC, FPGA, logic devices, etc.) or circuitry (e.g., processors, chips, etc.). The synthesizer may utilize any quantity of intermediate waveforms to generate the desired carrier signal or other waveform, where each synthesizer module may produce any quantity of intermediate waveforms. The various variables or indices mentioned herein (e.g., 'j', 'k', etc.) are preferably integer values and may contain integers within any desired range; however, these variables may be of any type and contain any desired values.

The synthesizer components (e.g., phase accumulator, phase-to-amplitude converter, analog-to-digital converter, modulation modules, etc.) may be of any quantity and may be implemented by any conventional or other components or circuitry performing the functions described herein. Alternatively, the synthesizer may be implemented by any quantity of processors (e.g., microprocessor, etc.) to determine amplitude values for and/or generate any quantity of intermediate waveforms. The processors may further include a digital-to-analog converter to produce the desired carrier signal or waveformns. The phase accumulator may be implemented by any quantity of any conventional or other devices accumulating a value (e.g., ALU, adder, etc.). Alternatively, the phase accumulator may include components (e.g., adders, ALU, multipliers, dividers, shifters, logic circuitry, etc.) to produce a phase value based on any mathematical and/or logical operations on input values (e.g., multiplication, division, shifts, subtraction, etc.). The increment and value registers may be of any quantity and may be implemented by any type of conventional or other storage or memory device (e.g., register, buffer, memory, etc.) and store any desired values. The phase accumulator may apply any type of phase or other offsets (e.g., phase modulation, frequency modulation, phase shift for intermediate waveforms, etc.) to the accumulated phase value. The output of the phase accumulator may include any quantity of bits for any desired resolution. The synthesizer may include a common phase accumulator or any quantity of phase accumulators to provide phase values for the digital synthesizers.

The phase-to-amplitude converter may be implemented by any type of memory or storage device (e.g., ROM, RAM, buffers, CORDIC algorithm, etc.) and may contain any desired information (e.g., sine values, cosine values, any mathematical information, etc.). Alternatively, the converter may be implemented by any quantity of devices or processors (e.g., microprocessor, circuitry, etc.) to produce the desired values. The phase-to-amplitude converter may include any quantity of outputs each providing any types of values (e.g., sine values, cosine values or any other mathematical values or information). The output of the phase-to-amplitude converter may indicate the amplitude value in any fashion (e.g., sine value, cosine value, other mathematical value or any combination thereof). The phase-to-amplitude converter may store amplitude values with various modulation (e.g., frequency, phase, amplitude, etc.) incorporated into those values to provide a modulated waveform value. The synthesizer may include a common phase-to-amplitude converter or any quantity of phase-to-amplitude converters to provide amplitude values for the waveform. The phase-to-amplitude converter may accommodate any quantity of phase values and provide corresponding amplitude values. The phase-to-amplitude converter may provide values including any quantity of bits for any desired resolution.

The digital synthesizer modules may perform any type of modulation (e.g., phase, frequency, amplitude, etc.) and/or encoding to produce modulated and/or encoded signals. The phase, frequency and amplitude modulation may be performed individually or in any desired combination and may utilize any offsets, constants or functions. The modulation and/or encoding may be performed in the digital and/or analog domain or in any combination thereof. The modulated and/or encoded values may include any quantity of bits for any desired resolution.

The synthesizer multiplexer may be of any quantity and may be implemented by any conventional or other multiplexers or selection devices (e.g., circuitry, logic, buffers, registers, etc.). The multiplexer may accommodate any quantity of inputs or outputs and include any quantity of control lines. The control lines may be driven by any suitable devices (e.g., counters, circuitry, processor, etc.). The multiplexer may select output from the digital synthesizer modules in any desired order or fashion suitable to produce the desired carrier signal or waveformns.

The digital-to-analog converter may be of any quantity and may be implemented by any conventional or other digital-to-analog converter(e.g., chip, circuitry, resistive ladder, etc.). The converter may process the amplitude samples at any desired rate.

The FPGA synthesizer may be implemented by any type of FPGA, ASIC, logic device or other circuitry. The FPGA may include the DAC and/or multiplexer and operate at any desired rate (e.g., generally less than the sampling rate of the desired carrier signal or waveformns). The FPGA components (e.g., adders, registers, truncate module, multiplier, waveform selection and modulation multiplexers, ROM, clock dividers, etc.) may be implemented by any conventional or other components performing the functions described herein. The various values (e.g., phase, modulation, truncation, etc.) may include any quantity of bits for any desired resolution. The waveform selection and/or DAC multiplexers may be combined or integrated in any fashion (e.g., a single 8:1 multiplexer may be employed, etc.), while the waveform selection, modulation and DAC mutliplexers may accommodate selection from any quantity of inputs. The multiplexers may be driven by any conventional or other devices (e.g., counters, logic, processor, etc.). The FPGA may include any quantity of registers to store any quantity of any types of values (e.g., phase offsets, modulation, etc.). The FPGA and/or synthesizer may include any types of modules (e.g., logic, circuitry, etc.) and/or be coupled to devices (e.g., interfaces, logic, processors, etc.) to provide and/or determine any information (e.g., offsets, rates, increments, modulation values, etc.) for generating the desired carrier signal or waveform. The FPGA and/or synthesizer may include any types of modules (e.g., clocks, etc.) and/or be coupled to devices to produce appropriate clock signals for operation. The phase, frequency and/or amplitude modulation may be enabled or disabled in any fashion (e.g., switches, multiplexers, mathematically, logically, etc.).

The present invention is not limited to the applications disclosed herein, but may be utilized in any high speed communications or other system to generate a carrier signal or other waveform requiring a sampling rate greater than a device (e.g., FPGA, ASIC, logic device, etc.) operational rate. The present invention effectively multiplies the device sampling rate by the quantity of parallel synthesizer modules employed (e.g., and is generally limited by the logic space of the device and sampling rate of the digital-to-analog converter).

From the foregoing description, it will be appreciated that the invention makes available a method and apparatus for high frequency digital carrier synthesis from plural intermediate carrier waveforms, wherein a digital synthesizer generates a high frequency signal from a plurality of intermediate frequency waveforms.

Having described preferred embodiments of a new and improved method and apparatus for high frequency digital carrier synthesis from plural intermediate carrier waveforms, it is believed that other modifications, variations and changes will be suggested to those skilled in the art in view of the teachings set forth herein. It is therefore to be understood that all such variations, modifications and changes are believed to fall within the scope of the present invention as defined by the appended claims.

What is claimed is:

1. An apparatus for generating an output waveform at a desired frequency comprising:

a plurality of waveform synthesizers each generating an intermediate waveform of an intermediate frequency and including a maximum sampling rate, wherein said intermediate frequency is less than said desired frequency and said maximum sampling rate is less than a minimum sampling frequency required for generation of said output waveform; and a waveform generator to combine said intermediate waveforms from said waveform synthesizers to produce said output waveform.

2. The apparatus of claim 1, wherein at least said plurality of synthesizers is in the form of at least one of a field programmable gate array (FPGA) and an application specific integrated circuit (ASIC).

3. The apparatus of claim 1, wherein said waveform synthesizers produce a quantity of said intermediate waveforms proportional to said minimum sampling frequency divided by said maximum sampling rate of said synthesizers.

4. The apparatus of claim 1, wherein each waveform synthesizer includes:

a phase accumulator to produce a phase value of said intermediate waveform; and a phase converter to generate intermediate waveform amplitudes in accordance with phase values produced by said phase accumulator to generate said intermediate waveform.

5. The apparatus of claim 4, wherein said intermediate waveform amplitudes generated by said phase converter are in the form of at least one of sine and cosine values.

6. The apparatus of claim 4, wherein each synthesizer further includes:

a modulation module to produce a modulated intermediate waveform;

wherein said waveform generator combines said modulated intermediate waveforms from said waveform synthesizers to produce said output waveform with modulation.

7. The apparatus of claim 6, wherein said modulation module includes:

a phase modulation module to apply a phase offset to said phase value to enable said phase converter to generate a phase modulated intermediate waveform;

wherein said waveform generator combines said phase modulated intermediate waveforms from said waveform synthesizers to produce said output waveform with phase modulation.

8. The apparatus of claim 6, wherein said modulation module includes:

a frequency modulation module to apply a frequency offset to said phase value to enable said phase converter to produce a frequency modulated intermediate waveform;

wherein said waveform generator combines said frequency modulated intermediate waveforms from said waveform synthesizers to produce said output waveform with frequency modulation.

9. The apparatus of claim 6, wherein said modulation module includes:

an amplitude modulation module to apply amplitude offsets to said intermediate waveform amplitudes to produce an amplitude modulated intermediate waveform;

wherein said waveform generator combines said amplitude modulated intermediate waveforms from said waveform synthesizers to produce said output waveform with amplitude modulation.

10. The apparatus of claim 4, wherein said waveform generator includes:

a multiplexer to combine said intermediate waveforms from said waveform synthesizers to produce a digital waveform corresponding to said output waveform; and a digital-to-analog converter to convert said digital waveform to said output waveform in analog form including said desired frequency.

11. The apparatus of claim 10, wherein each waveform synthesizer applies a corresponding phase offset to said phase value to produce said intermediate waveforms successively shifted in phase relative to each other and collectively encompassing samples of said output waveform.

12. The apparatus of claim 11, wherein said multiplexer selects and retrieves said output waveform samples from each successive intermediate waveform in a cyclical fashion to produce said digital waveform corresponding to said output waveform.

13. A method of generating an output waveform at a desired frequency comprising:

(a) generating a plurality of intermediate waveforms each of an intermediate frequency, wherein said intermediate waveforms are generated by corresponding waveform synthesizers including a maximum sampling rate and said intermediate frequency is less than said desired frequency and said maximum sampling rate is less than a minimum sampling frequency required for generation of said output waveform; and (b) combining said intermediate waveforms to produce said output waveform.

14. The method of claim 13, wherein step (a) further includes:

(a.1) generating a quantity of said intermediate waveforms proportional to said minimum sampling frequency divided by said maximum sampling rate of said synthesizers.

15. The method of claim 13, wherein step (a) further includes:

(a.1) generating each intermediate waveform by producing phase values of said intermediate waveform and determining intermediate waveform amplitudes in accordance with said produced phase values.

16. The method of claim 15, wherein step (a.1) further includes:

(a.1.1) determining said intermediate waveform amplitudes in the form of at least one of sine and cosine values.

17. The method of claim 15, wherein step (a.1) further includes:

(a.1.1) generating each intermediate waveform as a modulated waveform; and step (b) further includes:

(b.1) combining said modulated intermediate waveforms to produce said output waveform with modulation.

18. The method of claim 17, wherein step (a.1.1) further includes:

(a.1.1.1) applying a phase offset to said phase values to generate each intermediate waveform as a phase modulated waveform; and step (b.1) further includes:

(b.1.1) combining said phase modulated intermediate waveforms to produce said output waveform with phase modulation.

19. The method of claim 17, wherein step (a.1.1) further includes:

(a.1.1.1) applying a frequency offset to said phase values to generate each intermediate waveform as a frequency modulated waveform; and step (b.1) further includes:

(b.1.1) combining said frequency modulated intermediate waveforms to produce said output waveform with frequency modulation.

20. The method of claim 17, wherein step (a.1.1) further includes:

(a.1.1.1) applying amplitude offsets to said intermediate waveform amplitudes to generate each intermediate waveform as an amplitude modulated waveform; and step (b. 1) further includes:

(b.1.1) combining said amplitude modulated intermediate waveforms to produce said output waveform with amplitude modulation.

21. The method of claim 15, wherein step (b) further includes:

(b.1) combining said intermediate waveforms via a multiplexer to produce a digital waveform corresponding to said output waveform; and (b.2) converting said digital waveform to said output waveform in analog form including said desired frequency.

22. The method of claim 21, wherein step (a.1) further includes:

(a.1.1) applying a corresponding phase offset to said phase values to produce said intermediate waveforms successively shifted in phase relative to each other and collectively encompassing samples of said output waveform.

23. The method of claim 22, wherein step (b.1) further includes:

(b.1.1) selecting and retrieving said output waveform samples from each successive intermediate waveform in a cyclical fashion to produce said digital waveform corresponding to said output waveform.

* * * * *